(12) United States Patent
Sywyk (10) Patent No.: US 6,933,757 B1
(45) Date of Patent: Aug. 23, 2005

(54) TIMING METHOD AND APPARATUS FOR INTEGRATED CIRCUIT DEVICE

(75) Inventor: Stefan P. Sywyk, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/286,223

(22) Filed: Oct. 31, 2002

(51) Int. Cl.[7] .............. H03L 7/00; H03L 7/06; H03L 19/096; G11C 15/00
(52) U.S. Cl. ............ 327/144; 327/141; 327/156; 327/158; 326/93; 326/96; 365/49
(58) Field of Search ............ 326/93–99; 327/141–147, 327/155, 156, 158; 365/49, 201

(56) References Cited

U.S. PATENT DOCUMENTS

| | | | |
|---|---|---|---|
| 4,996,666 A | 2/1991 | Duluk | |
| 5,010,516 A | 4/1991 | Oates | |
| 5,072,422 A | 12/1991 | Rachels | |
| 5,440,715 A | 8/1995 | Wyland | |
| 5,517,441 A | 5/1996 | Dietz et al. | |
| 5,592,407 A | 1/1997 | Konishi et al. | |
| 5,859,791 A | 1/1999 | Schultz et al. | |
| 5,870,324 A | 2/1999 | Helwig et al. | |
| 5,949,696 A | 9/1999 | Threewitt | |
| 6,114,877 A * | 9/2000 | Brown et al. | ................. 326/96 |
| 6,144,574 A | 11/2000 | Kobayashi et al. | |
| 6,240,000 B1 | 5/2001 | Sywyk et al. | |
| 6,253,280 B1 | 6/2001 | Voelkel | |
| 6,268,746 B1 * | 7/2001 | Potter et al. | ................. 326/93 |

* cited by examiner

*Primary Examiner*—Nathan J. Flynn
*Assistant Examiner*—Johannes Mondt
(74) *Attorney, Agent, or Firm*—Bradley T. Sako (57) ABSTRACT

According to one embodiment, a timing circuit (300) can include a first control circuit (302), a first clocked circuit (304), a second clocked circuit (306), and a second control circuit (314). A first control circuit (302) may compensate for a first timing signal FCLK making a transition earlier in time than a second timing signal RCLK. A second control circuit (314) may compensate for a second timing signal RCLK making a transition earlier in time than a first timing signal FCLK. A first timing signal FCLK can be a periodic signal generated by a first PLL type circuit (310) in response to a falling edge of an external clock signal EXT CLK. A second timing signal RCLK can be a periodic signal generated by a second PLL type circuit (312) in response to a rising edge of an external clock signal EXT CLK.

3 Claims, 7 Drawing Sheets

TIMING METHOD AND APPARATUS FOR INTEGRATED CIRCUIT DEVICE

TECHNICAL FIELD

The present invention relates generally to timing circuits for integrated circuit devices, and more particularly to timing circuits for integrated circuit devices that include multiple clocks that can control separate portions of the same device.

BACKGROUND OF THE INVENTION

Many integrated circuit devices control internal operations according to one or more timing signals. For example, an integrated circuit may typically receive an external "clock" signal, and control various operations based on such a clock signal.

In some cases it can be desirable to operate different portions of an integrated circuit according to different timing signals. For example, certain circuit portions may operate based on a rising edge of a clock signal, while other portions may operate based on a falling edge of a clock signal. In some cases, data paths from different portions may have to be combined. Conventionally, combining data from paths controlled by different timing signals can lead to drawbacks in performance.

A novel approach to addressing different timing paths will now be described with reference to FIGS. 12 and 13.

Figure 12:
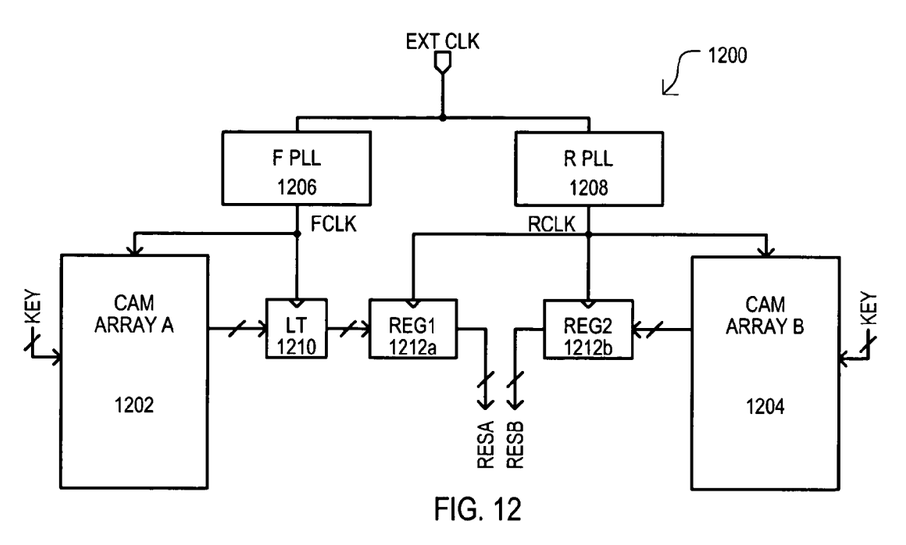
FIG. 12 is a block diagram of a novel timing arrangement for a CAM device.

FIG. 12 is a block diagram showing a timing arrangement for a content addressable memory (CAM) device. In FIG. 12, a CAM device is designated by the general reference character 1200, and may include a first circuit portion 1202 that operates according to a first timing signal FCLK and a second circuit portion 1204 that operates according to a second timing signal RCLK. In FIG. 12, first and second circuit portions (1202 and 1204) may comprise CAM arrays that receive key values (comparands) for comparison with entries that store data values.

In FIG. 12, a first timing signal FCLK may be generated by a first phase lock loop (PLL) circuit 1206, while a second timing signal RCLK may be generated by a second PLL circuit 1208. Both a first and second PLL circuit (1206 and 1208) may receive an external clock signal EXT CLK.

A first PLL circuit 1206 may be considered a "falling" edge circuit, and may generate a periodic signal FCLK having a transition corresponding to falling edges of a external clock signal EXT CLK. In FIG. 12, a first PLL circuit 1206 may generate a first timing signal FCLK having a "50/50" duty cycle. That is, a timing signal FCLK can transition high for essentially the same amount of time the signal transitions low. A first timing signal FCLK may control a first circuit portion 1202.

In a similar fashion, a second PLL circuit 1208 may be considered a "rising" edge circuit, and may generate a periodic signal RCLK having a transition corresponding to rising edges of an external clock signal EXT CLK. In FIG. 12, a second PLL circuit 1208 may generate a second timing signal RCLK having a "50/50" duty cycle. That is, a timing signal RCLK can transition high for essentially the same amount of time it transitions low. A second timing signal RCLK may control a second circuit portion 1204.

A CAM 1200 may also include a latch 1210 and registers 1212a and 1212b. A latch 1210 may receive data from a first circuit portion 1202, and latch such data according to first timing signal FCLK. A register 1212a may receive data from a latch 1210, and load and eventually output such data as result data RESA. A register 1212b may receive data from second circuit portion 1204, and load and eventually output such data as result data RESB. Both registers (1212a and 1212b) may latch and then output received data according to second timing signal RCLK.

The operation of the circuit of FIG. 12 will now be described with reference to FIG. 13. FIG. 13 is a timing diagram divided into two portions 1300 and 1302. Portion 1300 shows an operation when a received timing signal EXT CLK has a "50/50" duty cycle. Portion 1302 shows an operation when a received timing signal EXT CLK has a "40/60" duty cycle. That is, EXT CLK transitions high for 40% of a clock cycle, and low for a remaining 60% of a clock cycle.

Figure 13:
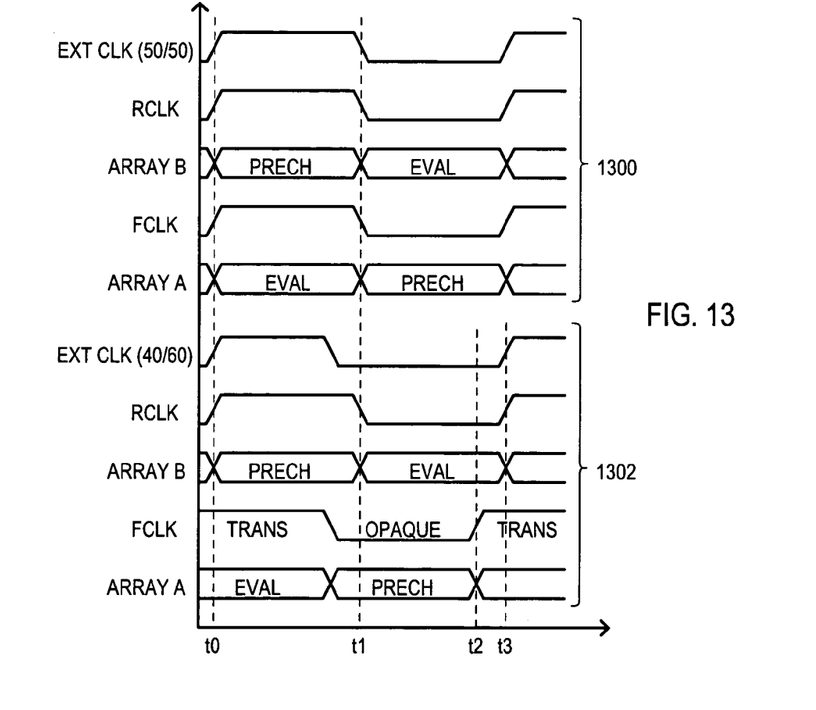
FIG. 13 is a timing diagram showing the operation of the circuit set forth in FIG. 12.

Both portions 1300 and 1302 of FIG. 13 show an external clock signal EXT CLK, a second timing signal RCLK, a second circuit portion ARRAY B operation, a first timing signal FCLK, and a first circuit portion ARRAY A operation. It is noted that second timing signal RCLK has a 50/50 duty cycle with a rising edge corresponding to a rising edge of the external clock signal EXT CLK. Similarly, first timing signal FCLK has a 50/50 duty cycle with a falling edge corresponding to a falling edge of the external clock signal EXT CLK.

Portion 1300 shows an ideal operation, in which data passes from a latch 1210, that operates according to a first timing signal FCLK, to a register 1212a, that operates according to a second timing signal RCLK.

In an ideal operation 1300, at time t0, a first timing signal FCLK can transition high. As a result, a first circuit portion 1202 may evaluate a key (i.e., perform a compare operation) and generate result data. At the same essential time, because an external clock has a 50/50 duty cycle, a second timing signal RCLK may also transition high. As a result, a second circuit portion 1204 may enter a precharge state.

Referring still to ideal operation 1300, between times t0 and t1, data may be output from a first circuit portion 1202. Further, because first timing signal FCLK is high, latch 1210 may be in a transparent state and may latch output data from a first circuit portion 1202. Conversely, because second timing signal RCLK is high at this time, registers 1212a and 1212b may output stored data, but not load new data. Thus, data output from latch 1210 may not be loaded into register 1212a, and data output from second circuit portion 1202 may not be loaded in register 1212b.

Referring still to ideal operation 1300, at time t1, a first timing signal FCLK can transition low. As a result, a first circuit portion 1202 may enter a precharge state. At the same essential time, because an external clock has a 50/50 duty cycle, a second timing signal RCLK may also transition low. As a result, a second circuit portion 1204 may evaluate a key (i.e., perform a compare operation) and generate result data.

Referring yet still to ideal operation 1300, after time t1, because first timing signal FCLK is low, latch 1210 may be in an opaque state, and thus can output latched data but not latch any new input data. Further, because second timing signal RCLK is low at this time, registers 1212a and 1212b may load new data. Thus, data output from latch 1210 can be loaded in register 1212a, and data output from second circuit portion 1204 can be loaded in register 1212b.

A drawback to the timing arrangements is shown in portion 1302 of FIG. 13. In portion 1302, a "high" portion of external clock signal EXT CLK is shorter in duration than a low portion (i.e., 40/60 duty cycle). However, first and second timing signals (FCLK and RCLK) maintain 50/50 duty cycles. Consequently, a rising edge of a first timing signal FCLK can "lead" (transition high) before a rising edge of a second timing signal (RCLK).

Referring now to portion 1302 of FIG. 13, at time t2 a first timing signal FCLK can transition high prior to second timing signal RCLK. As a result, a latch 1210 may enter a transparent state. However, at the same time, a second timing signal RCLK may be low, and not transition high until time t3. Thus, registers 1212a and 1212b may load input data. This is in contrast to a case in which registers 1212a and 1212b may be "closed" at this time. Such an arrangement may result in data currently latched within a register 1212a possibly being corrupted by data output from transparent latch 1210.

It would therefore be desirable to arrive at a way of addressing the above drawbacks to devices that include multiple timing signals.

SUMMARY OF THE INVENTION

According to the present invention, a circuit can include a first control circuit that logically combines a first periodic signal generated in response to first transitions in a clock signal and a second periodic signal generated in response to second transitions in the clock signal. In one arrangement, a first control circuit may include an AND-type gate.

According to one aspect of the invention, a circuit may also include a first phase lock loop (PLL) type circuit that receives a clock signal and generates a first periodic signal. In some arrangements, a circuit can also include a second PLL type circuit that receives the clock signal and generates a second periodic signal.

According to another aspect of the invention, a circuit can include a second control circuit that can extend a pulse width of a received periodic signal to generate a second periodic signal. In particular arrangements, a second control circuit can include a logic circuit having a first input coupled to the received periodic signal, and a delay circuit having an input coupled to the intermediate periodic signal and an output coupled to a second input of the logic circuit.

According to another aspect of the embodiments, a circuit may include a first clocked circuit that provides a data path between a first clocked circuit input and a first clocked circuit output in response to a first periodic signal.

According to another aspect of the embodiments, a circuit may include a second clocked circuit having an input coupled to a first clocked circuit output. A second clocked circuit may load data from a first clocked circuit and output such data in response to a second periodic signal.

The present invention also includes a method of controlling a content addressable memory (CAM) device. Such a method can include the steps of receiving a first periodic signal that transitions in response to a first edge of a clock signal, receiving a second periodic signal that transitions in response to a second edge of a clock signal, and logically combining first and second periodic signals to generate a first control signal.

According to one aspect of the embodiments, logically combining the first and second periodic signals can include AND-type combining.

According to another aspect of the embodiments, a method may also include generating a second periodic signal by extending a duration of pulses of an intermediate clock signal.

According to another aspect of the embodiments, a method may further include inputting data from a first portion of the CAM device in response a first control signal and inputting data from a second portion of the CAM device in response to a second periodic signal. In particular arrangements, a method may also include logically combining data input from the first and second portions of a CAM device.

The present invention may also be directed to a content addressable memory (CAM) device that includes a first storing circuit that receives first data in response to a logical combination of a first periodic signal and second periodic signal. Both a first and second periodic signal may be generated in response to a clock signal.

According to one aspect of the embodiments, a first storing circuit can include a latch.

According to another aspect of the embodiments, a CAM device may also include a second storing circuit that can receive first data from the first storing circuit in response to a first transition in a second periodic signal, and output first data in response to a second transition in a second periodic signal.

According to another aspect of the embodiments, a CAM device can include a third storing circuit that receives second data in response to a first transition in the second periodic signal, and outputs received second data in response to a second transition in the second periodic signal.

According to another aspect of the embodiments, a CAM device can include a first CAM array that generates first data in response to a first transition in a clock signal.

According to another aspect of the embodiments, a CAM device can include a second CAM array that generates second data in response to a second transition in a clock signal.

According to another aspect of the embodiments, a CAM device can include a first phase lock loop (PLL) type circuit that generates a first periodic signal, such first periodic signal having an essentially balanced duty cycle, and a second PLL type circuit that generates a second periodic signal, such second periodic signal having an essentially balanced duty cycle.

DETAILED DESCRIPTION OF THE EMBODIMENTS

Various embodiments will now be described in conjunction with a number of diagrams. The embodiments set forth circuits and methods for controlling various portions of a device according to two different timing signals.

Figure 1:
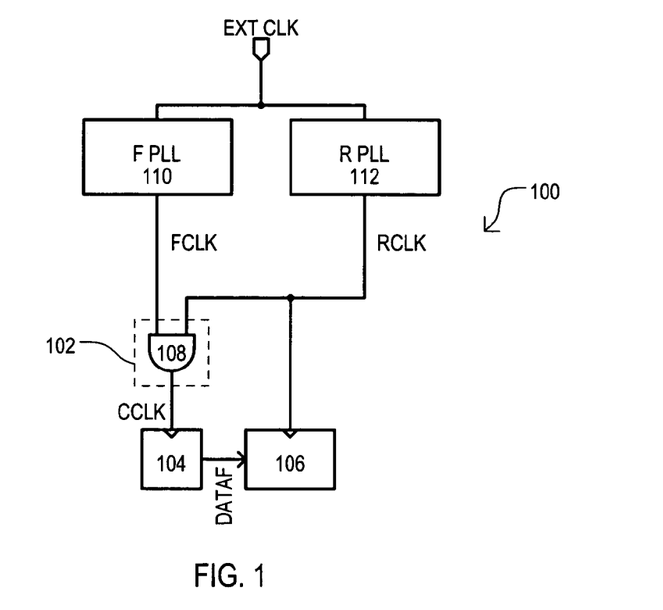
FIG. 1 is a block schematic diagram of a timing circuit according to a first embodiment.

Referring now to FIG. 1, a timing circuit according to a first embodiment is set forth in a block diagram and designated by the general reference character 100. A circuit 100 may include a first control circuit 102, a first clocked circuit 104, and a second clocked circuit 106. A first control circuit 102 may receive a first timing signal FCLK, a second timing signal RCLK, and provide a control timing signal shown as CCLK. A first control circuit 102 may compensate for timing differences between a first timing signal FCLK and a second timing signal RCLK that might otherwise corrupt a transfer of data between first and second clocked circuits (104 and 106).

In FIG. 1, a first control circuit 102 may include an AND-type gate 108. An AND-type gate 108 may logically combine a first timing signal FCLK and a second timing signal RCLK to generate control timing signal CCLK. In FIG. 1, AND-type gate 108 is an AND gate as it logically ANDs high portions of first and second timing signals (FCLK and RCLK) to compensate for a "leading" edge of one timing signal (e.g., rising edge of FCLK) with respect to another edge of another timing signal (e.g., a rising edge of RCLK). One skilled in the art would understand various other conventional circuit features may be added to address the combination of different logic values. As but a few of the many possible examples, an AND-type gate may include inverting inputs, inverting outputs, one or more NAND gates, and/or one or more NOR gates.

A first clocked circuit 104 may operate in response to a control timing signal CCLK. That is, a first clocked circuit 104 may execute a predetermined operation in response to a particular transition in a control timing signal CCLK. In the example of FIG. 1 it is assumed that first clocked circuit 104 executes an operation in response to a rising edge of control timing signal CCLK. As but one example, a first clocked circuit 104 may output data in response to a rising edge of control signal CCLK.

A second clocked circuit 106 may operate in response to a second timing signal RCLK. That is, a second clocked circuit 106 may execute a predetermined operation in response to a particular transition in a second timing signal RCLK. In the example of FIG. 1, it is assumed that a second clocked circuit 106 executes an operation in response to a rising edge of second timing signal RCLK. As but one example, a second clocked circuit 106 may isolate an input from first clocked circuit 104 in response to a rising edge of second timing signal RCLK.

In the example of FIG. 1, first and second timing signals (FCLK and RCLK) may be generated from a same source timing signal EXT CLK. More particularly, a source timing signal EXT CLK may be a periodic signal having different transitions. A first timing signal FCLK may be timed off one type of transition in a source timing signal EXT CLK (e.g., high-to-low) while a second timing signal RCLK may be timed off a different type of transition (e.g., low-to-high) in a source timing signal EXT CLK. Even more particularly, a first phase lock loop (PLL) type circuit 110 may receive a source timing signal EXT CLK and generate a first timing signal FCLK. Such a first timing signal FCLK may have an essentially 50/50 duty cycle and high-to-low transitions that essentially correspond in time to first transitions (e.g., high-to-low) of source timing signal EXT CLK. Similarly, a second PLL type circuit 112 may receive a source timing signal EXT CLK and generate a second timing signal RCLK. Such a second timing signal RCLK may have an essentially 50/50 duty cycle and low-to-high transitions that essentially correspond in time to second transitions (e.g., low-to-high) of source timing signal EXT CLK.

Of course, a PLL type circuit may include circuits in addition to, or other than phase lock loop circuits. As but one example, a PLL type circuit may include a delay lock loop (DLL) circuit.

Figure 2A:
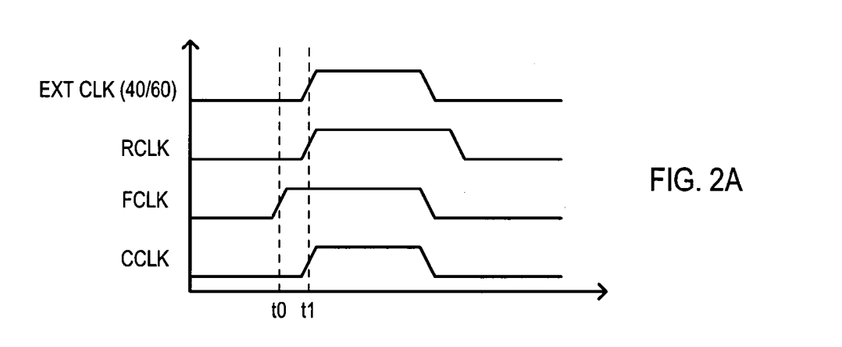
FIGS. 2A and 2B are timing diagrams showing the operation of the timing circuit of FIG. 1.

Referring now to FIG. 2A, a timing diagram is set forth, showing responses for various signals of FIG. 1. In particular, FIG. 2A shows an external clock signal EXT CLK, a first timing signal FCLK, a second timing signal RCLK, a control timing signal CCLK. In FIG. 2A, an external clock signal may have an "unequal" duty cycle. In particular, external clock signal EXT CLK has a 40/60 duty cycle.

As shown in FIG. 2A, because an external clock signal EXT CLK has a smaller high time (40%) than a low time (60%), a first timing signal FCLK may transition high prior to a corresponding transition in second timing signal RCLK. This is shown by a low-to-high transition in first timing signal FCLK at time t0 that precedes a low-to-high transition in second timing signal RCLK at time t1.

However, by generating a control timing signal CCLK with a logical combination of first and second timing signals (FCLK and RCLK), a control timing signal CCLK may have a transition corresponding to second timing signal RCLK. Thus, as shown in FIG. 2A, at time t0, control timing signal CCLK may have a low-to-high transition at time t1. This can correspond to a low-to-high transition in second timing signal RCLK at time t1.

In this way, a control circuit may generate a control timing signal by logically combining two other timing signals, where such other timing signals may be based on different transitions of a source timing signal. Further, one clocked circuit may receive a control timing signal while another clocked circuit may receive one of the other timing signals.

Thus, the embodiment of FIG. 1 may be effective in addressing a particular case, such as that shown in FIG. 2A, in which first and second timing signals (e.g., FCLK and RCLK) are generated in response to different edges of a control timing signal (e.g. CCLK) having one type of uneven duty cycle (e.g., high level is shorter in duration than low level).

While an approach such as that set forth in FIG. 1 can address drawbacks that may arise from a source timing signal having a shorter high portion than low portion (e.g., 40/60), such an approach may have drawbacks for different types of uneven duty cycle. This is illustrated in FIG. 2B.

Figure 2B:
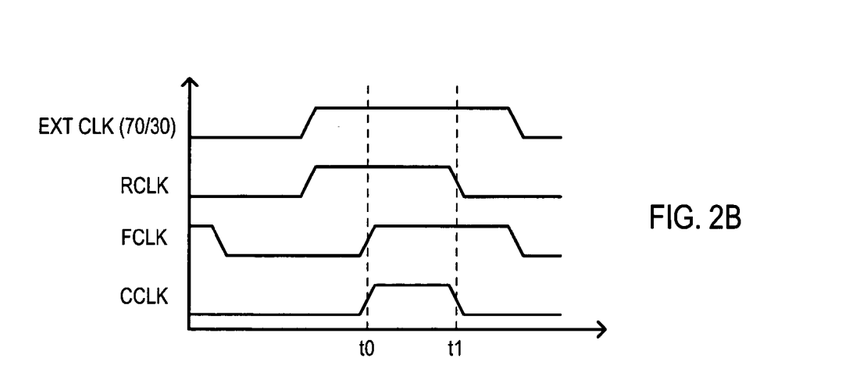

Referring now to FIG. 2B, a timing diagram is set forth, showing the same general responses as FIG. 2A. However, unlike FIG. 2A, FIG. 2B shows an external clock signal EXT CLK having a 70/30 duty cycle. Thus, FIG. 2B shows a response that may arise from a source timing signal having a longer high portion than low portion.

As shown in FIG. 2B, because an external clock signal EXT CLK has a larger high time (70%) than a low time (30%), a first timing signal FCLK may transition high after a corresponding transition in second timing signal RCLK. This is shown by a low-to-high transition at time t0.

However, if a first and second timing signal (FCLK and RCLK) are logically combined to generate a control timing signal CCLK, a control timing signal CCLK may transition low at essentially the same time a second timing signal RCLK transitions low. Consequently, a "high" duty cycle of control timing signal CCLK, shown from time t0 to t1, can be relatively short with respect to a full half cycle of a first or second timing signal (FCLK or RCLK). Such a shortened time period can limit an operating frequency of a timing circuit 100. As an operating frequency is increased, a time period t0 to t1 gets smaller. Eventually, such a time period may get too short for proper operation of a first clocked circuit 104.

Figure 3:
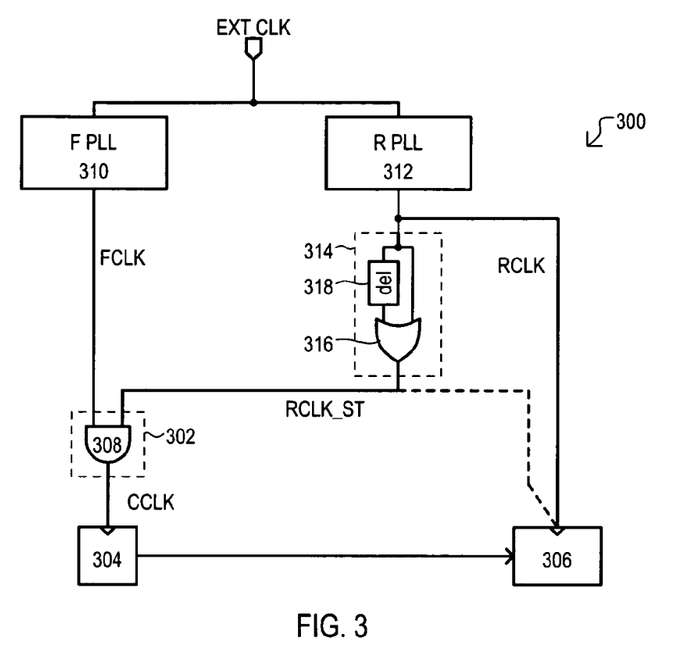
FIG. 3 is a block schematic diagram of a timing circuit according to a second embodiment.

A second embodiment is set forth in FIG. 3 that can address such a decrease in high time of a control timing signal CCLK.

Referring now to FIG. 3, a timing circuit according to a second embodiment is set forth in a block diagram and designated by the general reference character 300.

A timing circuit 300 may include some of the same general constituents as a first embodiment 100. Like constituents will be referred to by the same reference character but with a first digit being a "3" instead of a "1."

Unlike a first embodiment 100, a timing circuit 300 may further include a second control circuit 314. A second control circuit 314 may receive a second timing signal RCLK and provide a modified signal shown as RCLK_ST. A second control circuit 314 may compensate for a second timing signal RCLK making a transition earlier in time than a corresponding transition in a first timing signal FCLK.

In FIG. 3, a second control circuit 314 may include an OR-type gate 316 and a delay circuit 318. An OR-type gate 316 may receive a second timing signal RCLK at one input, and a same second timing signal RCLK, delayed by a delay circuit 318, at a second input. A resulting modified signal RCLK_ST may be conceptualized as being "stretched" with respect to a second timing signal RCLK. That is, a modified signal RCLK_ST may transition high at essentially the same time as second timing signal RCLK. However, modified signal RCLK_ST may not transition low until a predetermined delay after second timing signal RCLK transitions low.

A first control circuit 302 may logically combine a first timing signal FCLK with a modified timing signal RCLK_ST to generate a control timing signal CCLK. Further, a first clocked circuit 304 may operate in response to a control timing signal CCLK. Like FIG. 1, in FIG. 3 it is assumed that first clocked circuit 304 executes an operation in response to a rising edge of control timing signal CCLK.

In FIG. 3, a second clocked circuit 306 may operate in response to a second timing signal RCLK, or alternatively in response to a modified timing signal RCLK_ST. The latter case is represented by a dashed line between an output of a second control circuit 314 and a second clocked circuit 306. A second clocked circuit 306 may execute a predetermined operation in response to a particular transition in a received control signal (e.g., second timing signal RCLK or modified timing signal RCLK_ST). In FIG. 3, it is assumed that a second clocked circuit 306 can execute an operation in response to a rising edge of a received control timing signal (RCLK or RCLK_ST).

Figure 4:
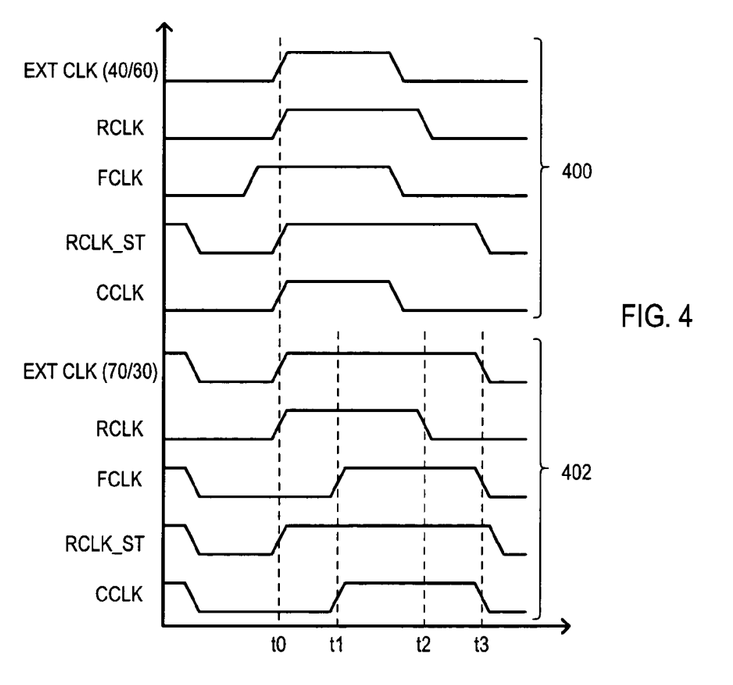
FIG. 4 is a timing diagram showing the operation of the timing circuit of FIG. 3.

Referring now to FIG. 4, a timing diagram is set forth showing responses for various signals of FIG. 3. In particular, FIG. 4 shows an external clock signal EXT CLK, a first timing signal FCLK, a second timing signal RCLK, a modified timing signal RCLK_ST, and a control timing signal CCLK. FIG. 4 is divided into two portions 400 and 402. A portion 400 shows a response of a timing circuit 300 when an external clock signal EXT CLK has a 40/60 duty cycle. A portion 402 shows a response of a timing circuit 300 when an external clock signal EXT CLK has a 70/30 duty cycle.

A portion 400 can have the same essential response as set forth in FIG. 2A. That is, a rising edge of a first timing signal FCLK may lead a rising edge of a second timing signal RCLK (and a rising edge of modified timing signal RCLK_ST). However, due to an AND-type gate 308, a resulting control timing signal CCLK can transition high at essentially the same time as a second timing signal RCLK (and a rising edge of modified timing signal RCLK_ST). This is shown at time t0 in FIG. 4.

A portion 402 can illustrate how a second control circuit 314 can address the drawback shown in FIG. 2B. That is, a falling edge of a first timing signal FCLK may lead a falling edge of a second timing signal RCLK, resulting in a shortened active (in this case high) portion of a clock cycle. However, due to second control circuit 314, a modified timing signal RCLK_ST may be "stretched." This is illustrated in FIG. 4 by modified timing signal RCLK_ST remaining high from time t0 to past time t3, while second timing signal RCLK is high from t0 to t2. Thus, when modified timing signal RCLK_ST is logically combined with a first timing signal FCLK, a resulting control timing signal CCLK may have an extended active (in this case high) portion of a clock cycle compared to that in FIG. 2B.

Unlike in FIG. 2B, control timing signal CCLK transitions low due to a low transition in a first timing signal FCLK at time t3. This is shown in FIG. 4 by control timing signal remaining high from time t1 to t3, instead of from time t1 to t2, as would occur in the case of the approach of FIG. 2B.

Figure 5:
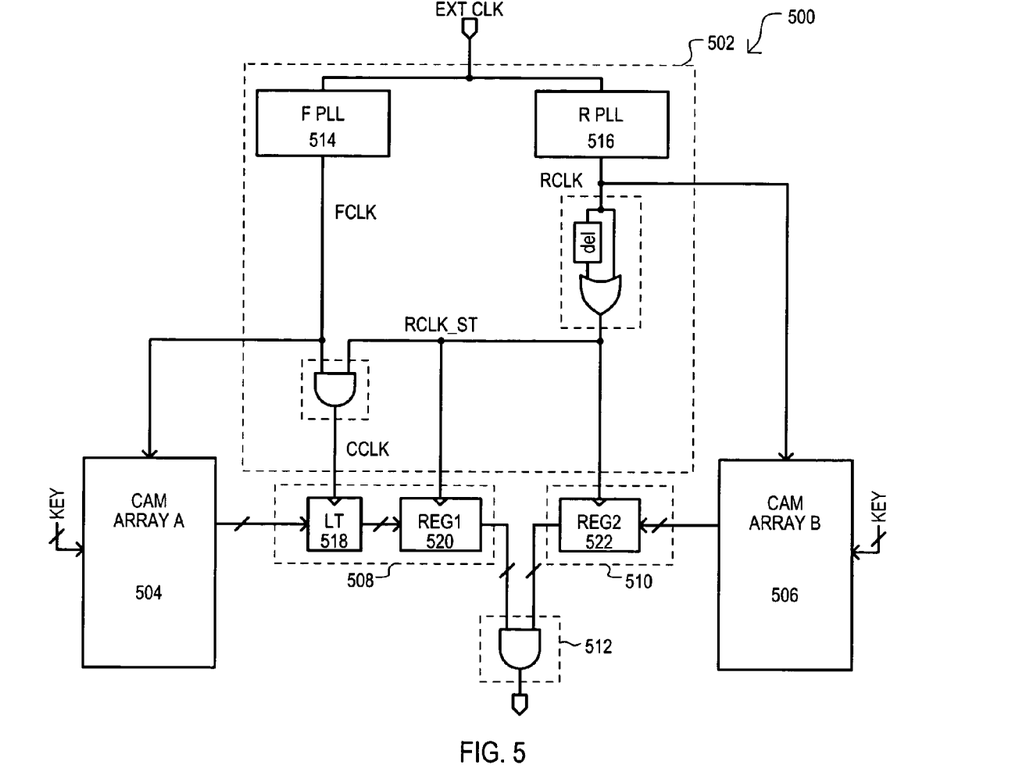
FIG. 5 is a block schematic diagram of a content addressable memory (CAM) device according to an embodiment.

While timing circuits as shown in FIGS. 1 and 3 may have various applications, one particular application can be in a content addressable memory (CAM) device. Such an application is shown in FIG. 5, and designated by the general reference character 500.

A CAM device 500 may include a timing circuit 502, a first circuit portion 504, a second circuit portion 506, a first clocked circuit 508, a second clocked circuit 510, and a logic circuit 512. A CAM device 500 may further include a first PLL-type circuit 514 and a second PLL type circuit 516.

A timing circuit 502, first PLL-type circuit 514, and second PLL-type circuit 516 may have essentially the same constituents as set forth in FIG. 3. Accordingly, descriptions of such portions will be omitted.

A first circuit portion 504 may comprise a CAM cell array (ARRAY A) that receives a key value and compares such a key value to a number of entries. A result of such a compare operation can be output to first clocked circuit 508. A first circuit portion 504 may operate in response to a first timing signal FCLK. More particularly, when a first timing signal FCLK has one value (e.g., high), a first circuit portion 504 may evaluate and output data. Preferably, a first circuit portion 504 may input a key value and output result data. Conversely, when a first timing signal FCLK has another value (e.g., low), a first circuit portion 504 may enter a "precharge" state and not necessarily output valid data.

A second circuit portion 506 may also comprise a CAM cell array (ARRAY B) that receives a key value and compares such a key value to a number of entries. A result of such a compare operation can be output to second clocked circuit 510. A second circuit portion 506 may operate in response to a second timing signal RCLK. Thus, in similar fashion to a first circuit portion 504, when a second timing signal RCLK has one value (e.g. low), a second circuit portion 506 may evaluate and output data. Preferably, a second circuit portion 506 may input a key value and output result data. Further, when a second timing signal RCLK has another value (e.g., high), a second circuit portion 506 may enter a "precharge" state and not necessarily output valid data.

A first clocked circuit 508 may operate in response to a control timing signal CCLK and a modified timing signal RCLK_ST. More particularly, a first clocked circuit 508 may input data in response to control timing signal CCLK and output data in response to a modified timing signal RCLK_ST. In one particular arrangement, a first clocked circuit 508 may include a latch 518 and a first register 520.

A latch 518 may receive result data from a first circuit portion 504, and output such data in response to control timing signal CCLK. More particularly, a latch 518 may be "transparent" (allow data to pass through) when a control timing signal CCLK has one value (e.g., is high), and be "opaque" (not allow data to pass through) when a control timing signal CCLK has another value (e.g., is low).

A register 520 may receive result data from a latch 518, and operate in response to a modified timing signal RCLK_ST. More particularly, a register 520 may "load" data (latch data but not output such data) when a modified timing signal RCLK_ST has one value (e.g., is low), and output data (and prevent the loading of new data) when a modified timing signal RCLK_ST has another value (e.g., is high).

A second clocked circuit 510 may include a second register 522. A second register 522 may operate in the same general fashion as a first register 520, but may receive result data from a second circuit portion 506.

A logic circuit 512 may receive output data from first and second clocked circuits (508 and 510), and logically combine such data. In the particular example of FIG. 5, a logic circuit 512 may perform an AND-type operation on such data.

Having described one general arrangement of a CAM device, the operation of such a device will now be described with reference to FIG. 6.

Figure 6:
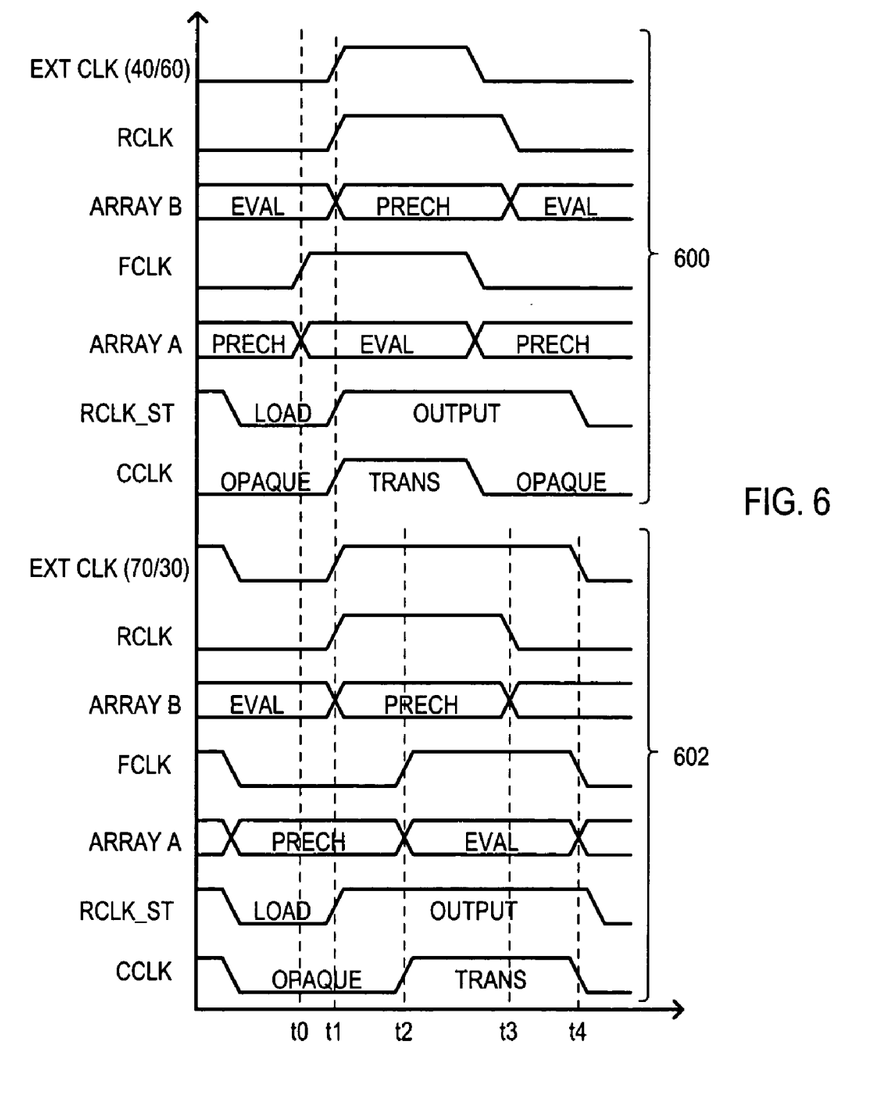
FIG. 6 is a timing diagram showing the operation of the CAM device of FIG. 5.

Referring now to FIG. 6, a timing diagram is set forth showing responses for various signals and circuits of FIG. 5. FIG. 6 includes some of the same responses as FIG. 4, including an external clock signal EXT CLK, a first timing signal FCLK, a second timing signal RCLK, a modified timing signal RCLK_ST, and a control timing signal CCLK. Unlike FIG. 4, FIG. 6 also shows a response of first circuit portion ARRAY A and a second circuit portion ARRAY B. Still further, a modified timing signal RCLK_ST also reflects a state of first and second registers (e.g., LOAD or OUTPUT) and a control timing signal CCLK also reflects a state of a latch (transparent "TRANS" or OPAQUE).

Like FIG. 4, FIG. 6 includes two portions, a first portion 600 reflecting a CAM device response to an external clock having a 40/60 duty cycle and a second portion 602 reflecting a CAM device response to an external clock having a 70/30 duty cycle.

Referring now to portion 600 of FIG. 6, at time t0, a first timing signal FCLK can transition high. This may result in a first circuit portion 504 ARRAY A entering an evaluation phase that can generate output data. At the same time, a modified timing signal RCLK_ST may be low, indicating that a first register 520 can load data. However, due to the operation of timing circuit 502, a control timing signal CCLK may remain low at time t0, preventing output data from a first circuit portion 504 ARRAY A, from being prematurely loaded into a first register 520. Thus, a control timing signal CCLK may transition high at time t1, at essentially the same time modified timing signal RCLK_ST transitions high, ending a loading state in a first register 520.

Referring now to portion 602 of FIG. 6, at time t2, a first timing signal FCLK can transition high. This may result in a first circuit portion 504 ARRAY A entering an evaluation phase as previously noted. Such an evaluation phase may conclude a time t4 when a first timing signal FCLK returns low. Due to timing circuit 502, a control timing signal CCLK may transition high at essentially the same time first timing signal FCLK transitions high. With control timing signal CCLK high at time t2, a latch 518 may enter a transparent state.

However, there may be some delay between a high transition in a first timing signal FCLK and the generation of valid output data from a first circuit portion 504. As shown in portion 602 of FIG. 6, a second timing signal RCLK can transition low at time t3. If a control timing signal CCLK was generated only by logically ANDing first and second timing signal (RCLK and FCLK), such a control timing signal could transition low at time t3, resulting in a control timing signal CCLK having a relatively short high pulse duration with respect to first and second timing signal high pulses. In such a short time period (e.g., t2 to t3) a first circuit portion 504 may not yet have generated valid data at this time. Thus, a latch 518 may enter an opaque state prematurely if controlled by a logical ANDing of RCLK and FCLK signals.

However, because of a timing circuit 502 a control timing signal CCLK can transition low no sooner than a first timing signal FCLK because of the first timing signal FCLK being logically ANDed with a "stretched" modified timing signal RCLK_ST. Consequently, control timing signal CCLK can transition low at time t4 and not time t3. This can allow a latch 518 to remain in a transparent state longer, giving more time for a first circuit portion 504 to generate valid data.

It is noted that for the timing circuit to operate as described above, a delay by which a modified timing signal RCLK_ST is "stretched" with respect to a second timing signal RCLK is preferably at least equal to the amount of time by which a duty cycle of an external clock signal EXT CLK may be distorted from a 50/50 arrangement. In this embodiment, such a time may be the amount of time an external clock EXT CLK may be high less the time it may be low for the maximum duty cycle. It is further noted that if the frequency can vary, while the maximum duty cycle is a normalized requirement (e.g., maximum of 70/30), which can often be the case in some systems, a delay (e.g., stretching) would likely have to vary as function of frequency as well. This could be accomplished by using "tap" points from delay elements of a PLL, as but one possible approach.

It is noted that while FIG. 5 shows a CAM device 500 in which first and second registers 520 and 522 may operate in response to a modified timing signal RCLK_ST, in alternate embodiments such circuits may operate in response to a second timing signal RCLK.

Figure 7:
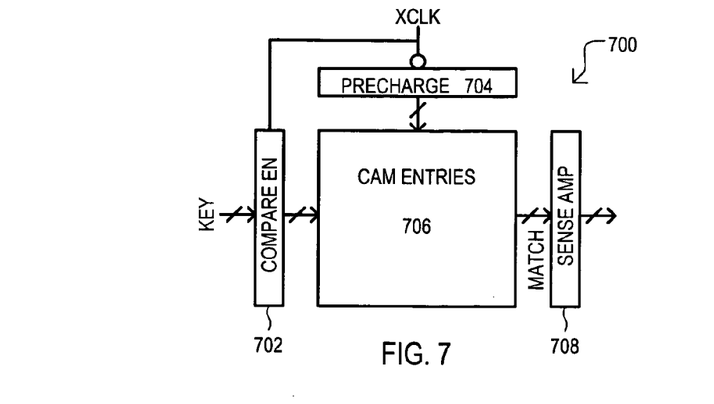
FIG. 7 is a block diagram of a CAM circuit portion according to one embodiment.

Referring now to FIG. 7, a block diagram of a CAM circuit portion according to one embodiment is set forth in a block diagram and designated by the general reference character 700. A CAM circuit portion 700 may include a compare enable circuit 702, a precharge circuit 704, CAM entries 706, and a sense amplifiers 708. A compare enable circuit 702 and precharge circuit 704 may operate in response to a signal XCLK. Referring back to FIG. 5, if a CAM circuit portion 700 is a first circuit portion (e.g., 504 in FIG. 5), a signal XCLK may be a first periodic signal FCLK. If a CAM circuit portion 700 is a second circuit portion (e.g., 506 in FIG. 5), a signal XCLK may be an inverted second periodic signal RCLK.

Referring back to FIG. 7, if a clock signal XCLK is high, a precharge circuit 704 may be disabled and a compare enable circuit 702 may be enabled. With a compare enable circuit 702 enabled, a key value can be compared to CAM entries 706. In response to a key value, CAM entries 706 can activate one or more match lines (MATCH). Active match lines may be amplified by sense amplifiers 708.

Referring still to FIG. 7, if a clock signal XCLK is low, a precharge circuit 704 may be enabled and a compare enable circuit 702 may be disabled. With a precharge circuit 704 enabled, CAM entries 706 and related circuits can be precharged to prepare such entries for a compare operation. In one arrangement, a precharge operation may include precharging match lines and/or bit lines, to name but two examples.

Figure 8:
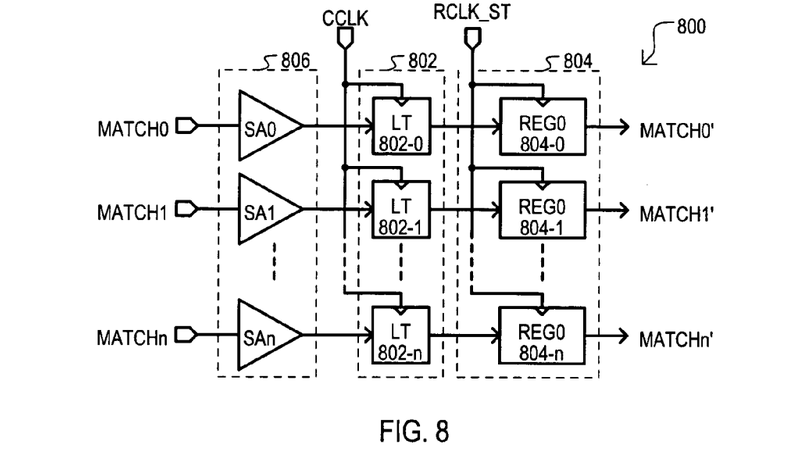
FIG. 8 is a schematic diagram of a clocked circuit of a CAM device according to an embodiment.

Referring now to FIG. 8, one example of a clocked circuit of a CAM device is set forth in a schematic diagram. A clocked circuit is designated by the general reference character 800, and may correspond to first clocked circuit 508 of FIG. 5. Clocked circuit 800 may include a latch 802, which may correspond to latch 518 of FIG. 5, and a register 804 that may correspond to register 520 of FIG. 5. FIG. 8 also shows sense amplifiers 806, which may correspond to sense amplifiers 708 of FIG. 7.

A latch 802 may include a number of latch circuits 802-0 to 802-*n*, each of which may receive an amplified match indication MATCH0 to MATCHn. Similarly, A register 804 may include a number of register circuits 804-0 to 804-*n*, each of which may receive an output value from a corresponding latch circuit (802-0 to 802-*n*).

In operation, CAM entries, or the like, may activate one or more match indications (MATCH0 to MATCHn). Each match indication (MATCH0 to MATCHn) can be amplified by a sense amplifier (SA0 to SAn). Outputs from sense amplifiers (SA0 to SAn) may be latched in corresponding latch circuits (802-0 to 802-*n*) according to a control timing signal CCLK. Outputs from latch circuits (802-0 to 802-*n*) may be loaded and output from corresponding register circuits (804-0 to 804-*n*) in response to a modified timing signal or second timing signal (RCLK_ST or RCLK).

Figure 9:
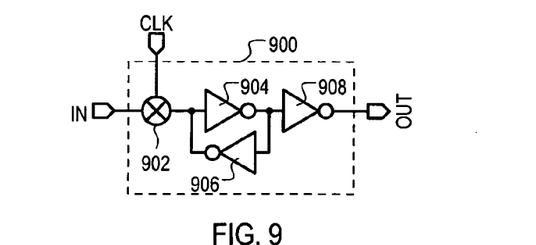
FIG. 9 is an example of a latch circuit according to an embodiment.

Referring now to FIG. 9, one example of a latch circuit is shown in a schematic diagram and designated by the general reference character 900. A latch circuit 900 may correspond to latch circuits 802-0 to 802-*n* of FIG. 8. A latch circuit 900 may include a transfer gate 902, a flip-flop formed by cross-coupled inverters 904 and 906, and an output inverter 908. A transfer gate 902 may be enabled when received clock signal CLK is high.

Figure 10:
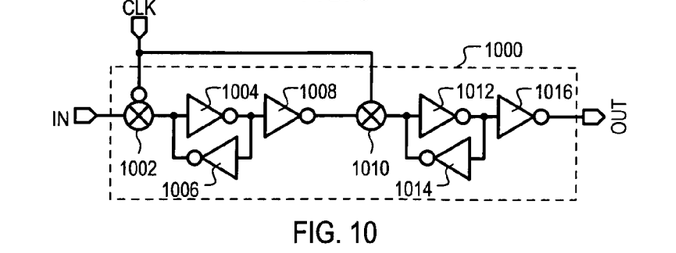
FIG. 10 is an example of a register circuit according to an embodiment.

Referring now to FIG. 10, one example of a register circuit is shown in a schematic diagram and designated by the general reference character 1000. A register circuit 1000 may correspond to register circuits 804-0 to 804-*n* of FIG. 8. A register circuit 1000 may include a first transfer gate 1002, a first flip-flop formed by cross-coupled inverters 1004 and 1006, and an inverter 1008. A second transfer gate 1010 can be situated between inverter 1008 and a flip-flop formed by cross-coupled inverters 1012 and 1014. An output inverter 1016 may provide an output signal from a register 1000.

In FIG. 10, a first transfer gate 1002 can receive a clock signal CLK, and may be enabled when a clock signal CLK is low. A second transfer gate 1010 can receive a clock signal CLK and may be enabled when a clock signal is high.

Of course, the particular latch and register circuits of FIGS. 9 and 10 are but possible examples of circuits that may be used in a CAM device like that of FIG. 5.

While the various figures have disclosed circuits and CAM devices according to various embodiments, the present invention can also be conceptualized as a method for controlling a CAM device. Such a method will now be described with reference to FIG. 11.

Figure 11:
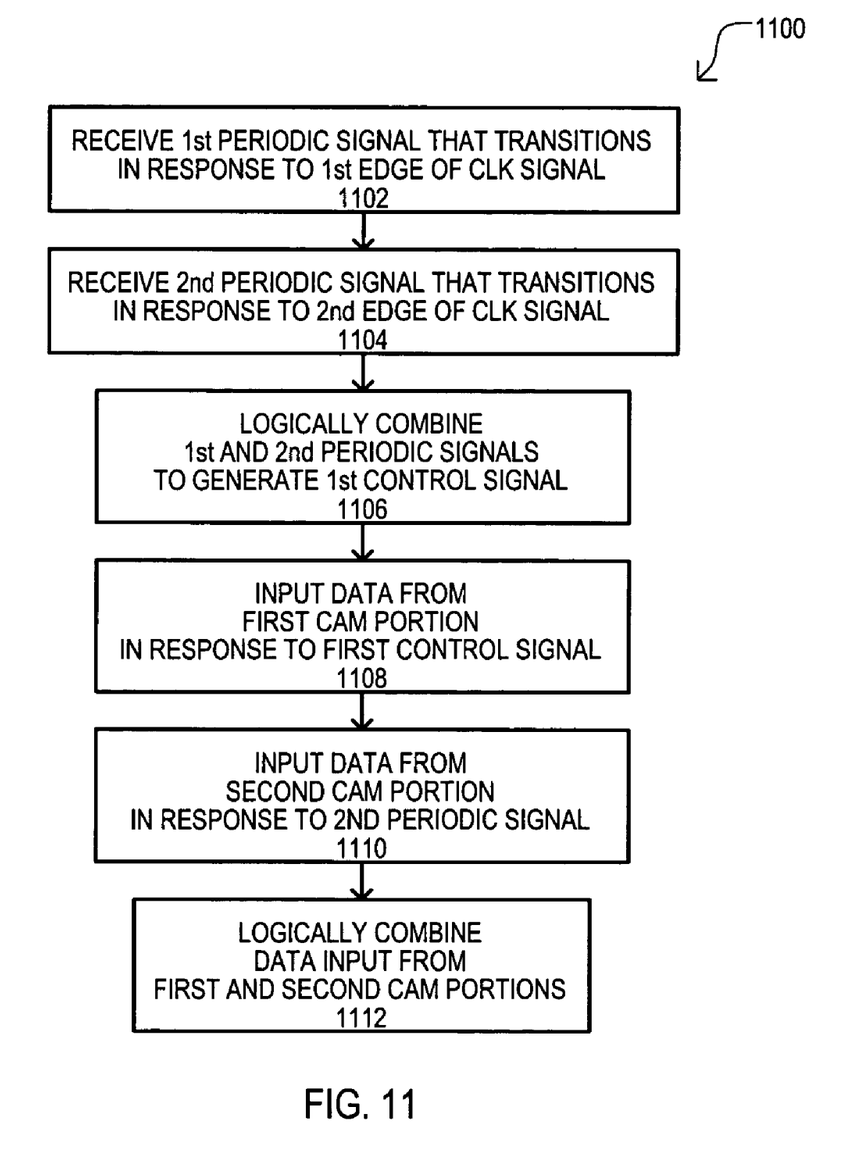
FIG. 11 is a flow diagram of a CAM control method according to an embodiment.

FIG. 11 is a flow diagram illustrating a CAM control method according to one embodiment. A CAM control method is designated by the general reference character 1100 and may include receiving a first periodic signal that transitions in response to a first edge of a clock signal (step 1102). A step 1102 may include receiving a first periodic signal that is generated by a PLL-like circuit in response to a source clock signal, such as an external clock signal. Such a first periodic signal may make a transition (e.g., high-to-low) in response to corresponding first transitions in a source clock signal (e.g., high-to-low).

A method 1100 can further include receiving a second periodic signal that transitions in response to a second edge of a clock signal (step 1104). A step 1104 may include receiving a second periodic signal that may make a transition (e.g., low-to-high) in response to corresponding second transitions in a source clock signal (e.g., low-to-high). In one approach, an intermediate clock signal may be generated by a PLL-like circuit in response to a source clock signal, such as an external clock signal. A second periodic signal may be the same as an intermediate clock signal. Alternatively, pulse widths of an intermediate clock signal may be extended in duration to generate a second periodic signal.

A method 1100 may also include logically combining first and second periodic signals to generate a first control signal (step 1106). A step 1106 may include logically ANDing first and second periodic signals.

This is in contrast to approaches like that shown in FIGS. 12 and 13, which can operate different portions of a CAM device in response to either a first periodic signal and/or a second periodic signal.

A method 1100 may further include inputting data from a first portion of a CAM device in response to a first control signal (step 1108). A step 1108 may include inputting data generated in a first portion of a CAM device. As but one very particular example, a step 1108 may include latching match indication data from CAM entries in response to a transition in a first control signal.

As shown in FIG. 11, a method 1100 can include inputting data from a second portion of a CAM device in response to a second periodic signal (step 1110). Like step 1108, a step 1100 may include inputting data generated in a second portion of a CAM device. As but one very particular example, a step 1110 may include loading and outputting data received from CAM entries in response to transitions in a second periodic signal.

In the particular example of FIG. 11, a method 1100 can include logically combining data input from first and second portions of a CAM device (step 1112). As but one very particular example, a step 1112 can include logically ANDing match indications from different portions of a CAM device.

In this way, a CAM device may be controlled according to a particular timing method to address drawbacks that may arise when a source timing signal does not have a 50/50 duty cycle.

More particularly, according to the present invention a CAM device may operate internally with a 50/50 duty cycle while an external clock can have a range of duty cycles that are not 50/50 (and even a range of frequencies as previously noted). Such a CAM device may operate while external data remains synchronous to external clock edges, thus such data is not required to be synchronous with an internal 50/50 duty cycle.

Thus, while the preferred embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A circuit, comprising:

a first control circuit that logically combines a first periodic signal and a second periodic signal, the first periodic signal being generated in response to a first transition in a clock signal and not in response to a second transition in the clock signal, the second periodic signal being generated in response to a second transition in the clock signal and not in response to the first transition in the clock signal; and a second control circuit that extends the pulse width of a received intermediate periodic signal to generate the second periodic signal and includes a logic circuit having a first input coupled to the intermediate periodic signal, and a delay circuit having an input coupled to the intermediate periodic signal and an output coupled to a second input of the logic circuit.

2. The circuit of claim 1, further including:

a first clocked circuit that provides a data path between a first clocked circuit input and a first clocked circuit output in response to the first periodic signal.

3. The circuit of claim 2, further including:

a second clocked circuit having an input coupled to the first clocked circuit output, the second clocked circuit loading and outputting received data in response to the second periodic signal.

* * * * *